United States Patent
Hung et al.

(10) Patent No.: US 12,249,511 B2
(45) Date of Patent: Mar. 11, 2025

(54) TREATMENTS TO IMPROVE DEVICE PERFORMANCE

(71) Applicant: Applied Materials, Inc., Santa Clara, CA (US)

(72) Inventors: Steven C. H. Hung, Sunnyvale, CA (US); Lin Dong, San Jose, CA (US); Benjamin Colombeau, San Jose, CA (US); Johanes F. Swenberg, Los Gatos, CA (US); Linlin Wang, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 80 days.

(21) Appl. No.: 17/192,213

(22) Filed: Mar. 4, 2021

(65) Prior Publication Data

US 2021/0193468 A1      Jun. 24, 2021

Related U.S. Application Data

(63) Continuation-in-part of application No. 17/092,039, filed on Nov. 6, 2020, now abandoned, and a
(Continued)

(51) Int. Cl.
*H01L 21/28*    (2006.01)
*H01L 21/02*    (2006.01)
*H01L 29/51*    (2006.01)

(52) U.S. Cl.
CPC .. *H01L 21/28202* (2013.01); *H01L 21/02181* (2013.01); *H01L 21/02205* (2013.01);
(Continued)

(58) Field of Classification Search
None
See application file for complete search history.

(56) References Cited

U.S. PATENT DOCUMENTS

| 5,891,798 A | 4/1999 | Doyle |
| 6,348,420 B1 | 2/2002 | Raaijmakers et al. |

(Continued)

FOREIGN PATENT DOCUMENTS

| CN | 102956465 A | * | 3/2013 |
| JP | 2007515786 A | | 6/2007 |
| JP | 2009529789 A | | 8/2009 |

OTHER PUBLICATIONS

Machine translation of CN 102956465 (Year: 2013).*

(Continued)

*Primary Examiner* — Erik Kielin
(74) *Attorney, Agent, or Firm* — Servilla Whitney LLC

(57) ABSTRACT

A method of forming a semiconductor structure includes annealing a surface of a substrate in an ambient of hydrogen to smooth the surface, pre-cleaning the surface of the substrate, depositing a high-κ dielectric layer on the pre-cleaned surface of the substrate, performing a re-oxidation process to thermally oxidize the surface of the substrate; performing a plasma nitridation process to insert nitrogen atoms in the deposited high-κ dielectric layer, and performing a post-nitridation anneal process to passivate chemical bonds in the plasma nitridated high-κ dielectric layer.

7 Claims, 7 Drawing Sheets

Related U.S. Application Data continuation-in-part of application No. 17/062,286, filed on Oct. 2, 2020, said application No. 17/092,039 is a continuation-in-part of application No. 16/403,312, filed on May 3, 2019, now Pat. No. 10,872,763.

(60) Provisional application No. 62/910,974, filed on Oct. 4, 2019.

(52) U.S. Cl.
CPC .. *H01L 21/28185* (2013.01); *H01L 21/28194* (2013.01); *H01L 29/517* (2013.01)

(56) References Cited

U.S. PATENT DOCUMENTS

| | | | |
|---|---|---|---|
| 6,617,639 | B1 | 9/2003 | Wang et al. |
| 6,627,503 | B2 | 9/2003 | Ma et al. |
| 6,723,581 | B1 | 4/2004 | Chabal et al. |
| 6,746,900 | B1 | 6/2004 | Liu et al. |
| 6,806,145 | B2 | 10/2004 | Kaukka et al. |
| 6,821,873 | B2 | 11/2004 | Visokay et al. |
| 6,921,702 | B2 | 7/2005 | Ahn et al. |
| 6,953,721 | B2 | 10/2005 | Agarwal et al. |
| 6,956,267 | B2 | 10/2005 | Hattangady et al. |
| 7,084,078 | B2 | 8/2006 | Ahn et al. |
| 7,700,988 | B2 | 4/2010 | Lin et al. |
| 8,420,208 | B2 | 4/2013 | Huang et al. |
| 8,722,485 | B1 | 5/2014 | Tong et al. |
| 8,778,816 | B2 | 7/2014 | Sato et al. |
| 10,347,492 | B2 | 7/2019 | Hung et al. |
| 10,872,763 | B2 | 12/2020 | Chu et al. |
| 2004/0198069 | A1 | 10/2004 | Metzner et al. |
| 2004/0266217 | A1* | 12/2004 | Kim .................. H01L 21/3142 |
| | | | 438/785 |
| 2005/0037630 | A1 | 2/2005 | Doh et al. |
| 2005/0124109 | A1 | 6/2005 | Quevedo-Lopez et al. |
| 2005/0124121 | A1 | 6/2005 | Rotondaro et al. |
| 2005/0170667 | A1 | 8/2005 | Conley, Jr. et al. |
| 2006/0001071 | A1 | 1/2006 | Brask et al. |
| 2006/0040483 | A1* | 2/2006 | Niimi ................ H01L 21/28202 |
| | | | 257/E21.247 |
| 2007/0039924 | A1 | 2/2007 | Dip et al. |
| 2007/0093013 | A1 | 4/2007 | Chua et al. |
| 2007/0207628 | A1 | 9/2007 | Chua |
| 2007/0209930 | A1* | 9/2007 | Chua ................ H01J 37/32082 |
| | | | 204/298.02 |
| 2007/0212895 | A1* | 9/2007 | Chua ................ H01L 21/28185 |
| | | | 438/758 |
| 2007/0212896 | A1* | 9/2007 | Olsen ................ H01L 21/02197 |
| | | | 438/758 |
| 2007/0218623 | A1* | 9/2007 | Chua ................... H01L 21/0234 |
| | | | 257/E21.279 |
| 2007/0287199 | A1 | 12/2007 | Hsu |
| 2008/0087970 | A1 | 4/2008 | Verhaverbeke |
| 2009/0117750 | A1* | 5/2009 | OuYang ........... H01L 21/02236 |
| | | | 257/632 |
| 2010/0102376 | A1 | 4/2010 | Ma et al. |
| 2010/0239758 | A1 | 9/2010 | Kher et al. |
| 2011/0124172 | A1 | 5/2011 | Jeong et al. |
| 2011/0207314 | A1 | 8/2011 | Niimi et al. |
| 2012/0088356 | A1 | 4/2012 | Santhanam et al. |
| 2012/0220116 | A1* | 8/2012 | Noori .................... H01L 29/517 |
| | | | 438/591 |
| 2012/0248545 | A1* | 10/2012 | Yugami ............ H01L 21/28194 |
| | | | 257/E21.632 |
| 2016/0005832 | A1 | 1/2016 | Chang et al. |
| 2016/0035575 | A1 | 2/2016 | Ouyang et al. |
| 2018/0218911 | A1 | 8/2018 | Hung et al. |
| 2019/0148416 | A1* | 5/2019 | Rui .................... H01L 21/02192 |
| | | | 257/71 |
| 2019/0287805 | A1 | 9/2019 | Hung et al. |
| 2021/0057215 | A1 | 2/2021 | Hung et al. |
| 2021/0104401 | A1 | 4/2021 | Hung et al. |

OTHER PUBLICATIONS

PCT International Search Report and Written Opinion in PCT/US2022/018427 dated Jun. 17, 2022, 10 pages.

"Electron Work Function of the Elements", https://public.wsu.edu/pchemlab/documents/Workunctionvalues.pdf.

International Search Report and Written Opinion mailed Aug. 5, 2020 in International Patent Application No. PCT/US2020/028071, 9 pages.

International Search Report and Written Opinion mailed Feb. 17, 2021 in International Patent Application No. PCT/US2020/057380, 11 pages.

International Search Report and Written Opinion mailed Jan. 22, 2021 in International Patent Application No. PCT/US2020/054079, 11 pages.

Filliot, F., et al., "Study of metal gate work function modulation using plasma and Sil-14 treated TiN thin films", Article, Mat. Res. Soc. Symp. Proc. vol. 786, 2004, Accessed Online.

Hasan, MD, Mehedi, "Work Function Tuning in Sub-20nm Titanium Nitride (TiN) Metal Gate: Mechanism and Engineering", King Abdullah University of Science and Technology, Thuwal, Kingdom of Saudi Arabia, Jul. 2011, 68 pages.

Machine Translation of CN102956465A.

* cited by examiner

TREATMENTS TO IMPROVE DEVICE PERFORMANCE

CROSS-REFERENCE TO RELATED APPLICATIONS

This application is a continuation-in-part of U.S. application Ser. No. 17/092,039, filed on Nov. 6, 2020, which is a continuation-in-part of U.S. application Ser. No. 16/403,312, filed on May 3, 2019, issued as U.S. Pat. No. 10,872,763 on Dec. 22, 2020, and this application is a continuation-in-part of U.S. application Ser. No. 17/062,286, filed on Oct. 2, 2020, which claims priority to U.S. Provisional Application Ser. No. 62/910,974, filed on Oct. 4, 2019, the entire disclosures of which are hereby incorporated by reference herein.

TECHNICAL FIELD

Embodiments of the present disclosure generally relate to semiconductor devices, systems, processes, equipment, and fabrication. More particularly, embodiments relate to treatments to enhance device performance in gate structures.

BACKGROUND

As metal-oxide-semiconductor field-effect transistors (MOSFETs) have decreased in size to achieve high device performance and low power consumption, the thickness of a traditional silicon dioxide ($SiO_2$) gate dielectric has decreased to its physical limit. As a result, replacing the silicon dioxide gate dielectric with a high-κ dielectric material has been inevitable to achieve further scaling. Among various high-κ dielectric materials, hafnium oxide ($HfO_2$) has been applied since the 45 nm MOSFET technology node due to its high dielectric constant and superior thermal stability on a silicon substrate. However, for further scaling of equivalent oxide thickness (EOT) for the 32 nm MOSFET technology node and beyond, simply decreasing the thickness of a high-κ dielectric material layer is problematic due to an increase of leakage current through the high-κ dielectric material layer.

Thus, there is a need for systems and methods that can be used to form thin (e.g., EOT less than 1 nm) high-κ dielectric material layers having chemical structures that can be controlled to ensure desired structural and electrical properties.

SUMMARY

One or more embodiments of the disclosure are directed to methods of forming a semiconductor device. In one or more embodiments, the method comprises: annealing a surface of a substrate to form a smooth surface; pre-cleaning the smooth surface to form a pre-cleaned surface; depositing a high-κ dielectric layer on the pre-cleaned surface; performing a re-oxidation process to thermally oxidize the substrate; performing a plasma nitridation process to insert nitrogen atoms in the high-κ dielectric layer to form a plasma nitridated high-κ dielectric layer; and performing a post-nitridation anneal process to passivate chemical bonds in the plasma nitridated high-κ dielectric layer.

One or more embodiments of the disclosure are directed to methods of forming a semiconductor device. In one or more embodiments, the method comprises: annealing a surface of a substrate to form a smooth surface; forming a high-κ dielectric layer on the surface of the substrate; performing a re-oxidation process to thermally oxidize the surface of the substrate; performing a plasma nitridation process to insert nitrogen atoms in the high-κ dielectric layer to form a plasma nitridated high-κ dielectric layer; and performing a post-nitridation anneal process to passivate chemical bonds in the plasma nitridated high-κ dielectric layer.

Other embodiments of the disclosure are directed to processing systems. In one or more embodiments, a processing system comprises: a first processing chamber; a second processing chamber; a third processing chamber; a fourth processing chamber; a fifth processing chamber; and a system controller, the system controller configured to: anneal a surface of a substrate to form a smooth surface in the first processing chamber; deposit a high-κ dielectric layer on the surface of the substrate in the second processing chamber; expose the deposited high-κ dielectric layer to nitrogen plasma to form a plasma nitridated high-κ dielectric layer in the third processing chamber; perform a re-oxidation process to thermally oxidize the surface of the substrate in the fourth processing chamber; and anneal the plasma nitridated high-κ dielectric layer in the fifth processing chamber, wherein the substrate is transferred among the first, second, third, fourth, and fifth processing chambers without breaking vacuum environment in the processing system.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, when possible, to designate elements that are common to the figures. It is contemplated that elements and features of one embodiment may be beneficially incorporated in other embodiments without further recitation.

DETAILED DESCRIPTION

Figure 1:
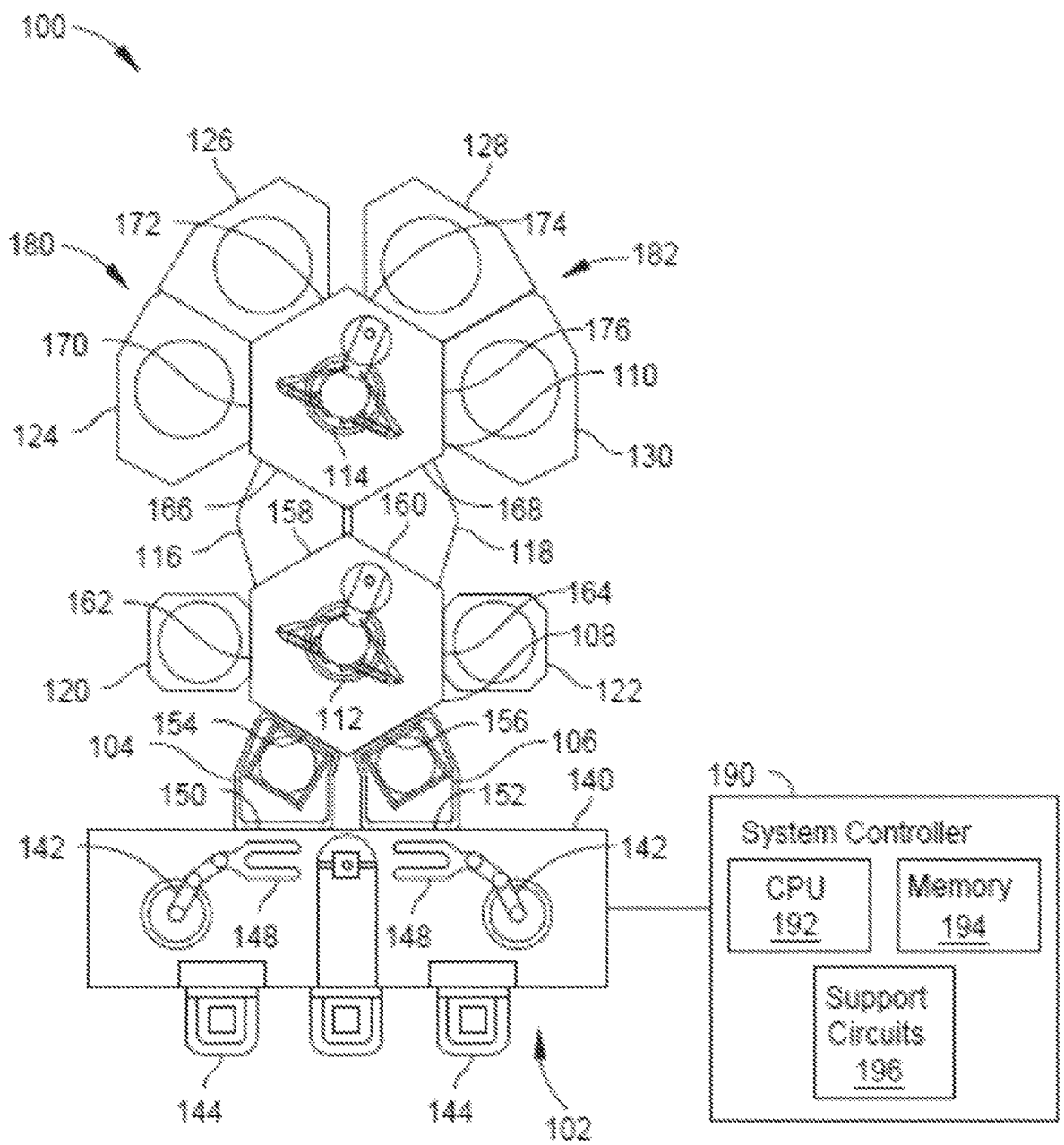
FIG. 1 is a schematic top-view diagram of an example multi-chamber processing system according to one or more embodiments.

Before describing several exemplary embodiments of the disclosure, it is to be understood that the disclosure is not limited to the details of construction or process steps set forth in the following description. The disclosure is capable of other embodiments and of being practiced or being carried out in various ways.

As gate structures scale to smaller dimensions, new material structures are being sought to provide improvements. The use of high-κ dielectric materials increases the dielectric constant of the gate structure over conventional gate structures that utilize materials such as silicon oxide. However, similar to silicon oxide, as the thickness of a gate structure is reduced, leakage currents increase. For example, gate leakage increases as the effective oxide thickness decreases. Hence, the inverse relationship between gate leakage and effective oxide thickness may form a limit on the performance of the transistor and the device produced.

High-κ dielectric materials may provide greater channel mobility over silicon oxide at similar thicknesses. As the industry continues to seek lower effective oxide thicknesses without increased gate leakage, efforts to maximize a dielectric constant (also referred to as "κ-value") of known high-κ materials are reaching limits due to morphological characteristics. Conventional technologies have struggled to overcome natural characteristics of high-κ materials, which may set an upper limit in the κ-value, and subsequent device remodeling in attempts to incorporate new films.

The embodiments described herein provide systems and methods for improving the characteristics of high-κ dielectric materials. By producing high-κ dielectric materials exhibiting a specific morphology or a grain structure, higher dielectric constants and subsequent improved device performance may be enabled. In order to control grain formation in exemplary devices, treatments may be performed to provide activated substrate surfaces that can induce a specific grain growth, as well as to stabilize films after formation, which may result in a higher dielectric constant.

The embodiments described herein provide a hydrogen annealing process that smooths the surface of a substrate, e.g., silicon, before film deposition. During later high temperature anneal processes, the hydrogen-silicon bonds are broken, and the hydrogen is depassivated. This differs from standard hydrogen passivation processes, wherein hydrogen-silicon bonding is maintained through the formation of the final device.

As used in this specification and the appended claims, the term "substrate" refers to a surface, or portion of a surface, upon which a process acts. It will also be understood by those skilled in the art that reference to a substrate can also refer to only a portion of the substrate unless the context clearly indicates otherwise. Additionally, reference to depositing on a substrate can mean both a bare substrate and a substrate with one or more films or features deposited or formed thereon.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present disclosure, any of the film processing steps disclosed may also be performed on an under-layer formed on the substrate as disclosed in more detail below, and the term "substrate surface" is intended to include such under-layer as the context indicates. Thus, for example, where a film/layer or partial film/layer has been deposited onto a substrate surface, the exposed surface of the newly deposited film/layer becomes the substrate surface.

As used in this specification and the appended claims, the terms "precursor", "reactant", "reactive gas" and the like are used interchangeably to refer to any gaseous species that can react with the substrate surface.

FIG. 1 is a schematic top-view diagram of an example of a multi-chamber processing system 100 according to some examples of the present disclosure. The processing system 100 generally includes a factory interface 102, load lock chambers 104, 106, transfer chambers 108, 110 with respective transfer robots 112, 114, holding chambers 116, 118, and processing chambers 120, 122, 124, 126, 128, 130. As detailed herein, wafers in the processing system 100 can be processed in and transferred between the various chambers without exposing the wafers to an ambient environment exterior to the processing system 100 (e.g., an atmospheric ambient environment such as may be present in a fab). For example, the wafers can be processed in and transferred between the various chambers in a low pressure (e.g., less than or equal to about 300 Torr) or vacuum environment without breaking the low pressure or vacuum environment between various processes performed on the wafers in the processing system 100. Accordingly, the processing system 100 may provide for an integrated solution for some processing of wafers.

Examples of a processing system that may be suitably modified in accordance with the teachings provided herein include the Endura®, Producer® or Centura® integrated processing systems or other suitable processing systems commercially available from Applied Materials, Inc., located in Santa Clara, California. It is contemplated that other processing systems (including those from other manufacturers) may be adapted to benefit from aspects described herein.

In the illustrated example of FIG. 1, the factory interface 102 includes a docking station 140 and factory interface robots 142 to facilitate transfer of wafers. The docking station 140 is configured to accept one or more front opening unified pods (FOUPs) 144. In some examples, each factory interface robot 142 generally comprises a blade 148 disposed on one end of the respective factory interface robot 142 configured to transfer the wafers from the factory interface 102 to the load lock chambers 104, 106.

The load lock chambers 104, 106 have respective ports 150, 152 coupled to the factory interface 102 and respective ports 154, 156 coupled to the transfer chamber 108. The transfer chamber 108 further has respective ports 158, 160 coupled to the holding chambers 116, 118 and respective ports 162, 164 coupled to processing chambers 120, 122. Similarly, the transfer chamber 110 has respective ports 166, 168 coupled to the holding chambers 116, 118 and respective ports 170, 172, 174, 176 coupled to processing chambers 124, 126, 128, 130. The ports 154, 156, 158, 160, 162, 164, 166, 168, 170, 172, 174, 176 can be, for example, slit valve openings with slit valves for passing wafers therethrough by the transfer robots 112, 114 and for providing a seal between respective chambers to prevent a gas from passing between the respective chambers. Generally, any port is open for transferring a wafer therethrough. Otherwise, the port is closed.

The load lock chambers 104, 106, transfer chambers 108, 110, holding chambers 116, 118, and processing chambers 120, 122, 124, 126, 128, 130 may be fluidly coupled to a gas and pressure control system (not specifically illustrated). The gas and pressure control system can include one or more gas pumps (e.g., turbo pumps, cryo-pumps, roughing pumps), gas sources, various valves, and conduits fluidly coupled to the various chambers. In operation, a factory interface robot 142 transfers a wafer from a FOUP 144 through a port 150 or 152 to a load lock chamber 104 or 106. The gas and pressure control system then pumps down the load lock chamber 104 or 106. The gas and pressure control system further maintains the transfer chambers 108, 110 and holding chambers 116, 118 with an interior low pressure or vacuum environment (which may include an inert gas). Hence, the pumping down of the load lock chamber 104 or 106 facilitates passing the wafer between, for example, the atmospheric environment of the factory interface 102 and the low pressure or vacuum environment of the transfer chamber 108.

With the wafer in the load lock chamber 104 or 106 that has been pumped down, the transfer robot 112 transfers the wafer from the load lock chamber 104 or 106 into the transfer chamber 108 through the port 154 or 156. The transfer robot 112 is then capable of transferring the wafer to and/or between any of the processing chambers 120, 122 through the respective ports 162, 164 for processing and the holding chambers 116, 118 through the respective ports 158, 160 for holding to await further transfer. Similarly, the transfer robot 114 is capable of accessing the wafer in the holding chamber 116 or 118 through the port 166 or 168 and is capable of transferring the wafer to and/or between any of the processing chambers 124, 126, 128, 130 through the respective ports 170, 172, 174, 176 for processing and the holding chambers 116, 118 through the respective ports 166, 168 for holding to await further transfer. The transfer and holding of the wafer within and among the various chambers can be in the low pressure or vacuum environment provided by the gas and pressure control system.

The processing chambers 120, 122, 124, 126, 128, 130 can be any appropriate chamber for processing a wafer. In some embodiments, the processing chamber 120 can be capable of performing an annealing process, the processing chamber 122 can be capable of performing a cleaning process, and the processing chambers 124, 126, 128, 13o can be capable of performing epitaxial growth processes. In some examples, the processing chamber 122 can be capable of performing a cleaning process, the processing chamber 120 can be capable of performing an etch process, and the processing chambers 124, 126, 128, 130 can be capable of performing respective epitaxial growth processes. The processing chamber 122 may be a SiCoNi™ Preclean chamber available from Applied Materials of Santa Clara, Calif. The processing chamber 120 may be a Selectra™ Etch chamber available from Applied Materials of Santa Clara, Calif.

A system controller 190 is coupled to the processing system 100 for controlling the processing system 100 or components thereof. For example, the system controller 190 may control the operation of the processing system 100 using a direct control of the chambers 104, 106, 108, 116, 118, 110, 120, 122, 124, 126, 128, 130 of the processing system 100 or by controlling controllers associated with the chambers 104, 106, 108, 116, 118, 110, 120, 122, 124, 126, 128, 130. In operation, the system controller 190 enables data collection and feedback from the respective chambers to coordinate performance of the processing system 100.

The system controller 190 generally includes a central processing unit (CPU) 192, memory 194, and support circuits 196. The CPU 192 may be one of any form of a general-purpose processor that can be used in an industrial setting. The memory 194, or non-transitory computer-readable medium, is accessible by the CPU 192 and may be one or more of memory such as random-access memory (RAM), read only memory (ROM), floppy disk, hard disk, or any other form of digital storage, local or remote. The support circuits 196 are coupled to the CPU 192 and may comprise cache, clock circuits, input/output subsystems, power supplies, and the like. The various methods disclosed herein may generally be implemented under the control of the CPU 192 by the CPU 192 executing computer instruction code stored in the memory 194 (or in memory of a particular process chamber) as, for example, a software routine. When the computer instruction code is executed by the CPU 192, the CPU 192 controls the chambers to perform processes in accordance with the various methods.

Other processing systems can be in other configurations. For example, more or fewer processing chambers may be coupled to a transfer apparatus. In the illustrated example, the transfer apparatus includes the transfer chambers 108, 110 and the holding chambers 116, 118. In other examples, more or fewer transfer chambers (e.g., one transfer chamber) and/or more or fewer holding chambers (e.g., no holding chambers) may be implemented as a transfer apparatus in a processing system.

Figure 2:
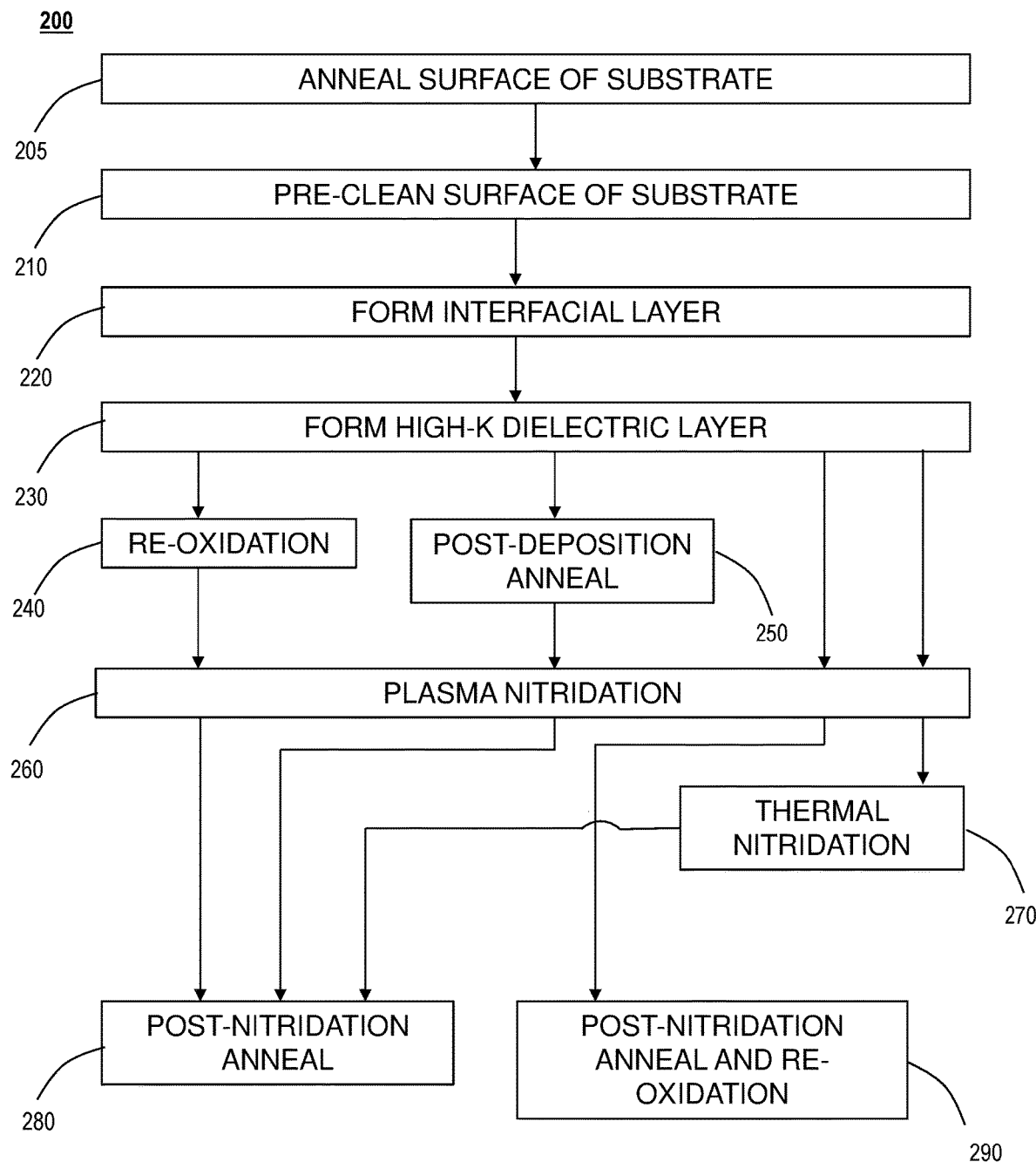
FIG. 2 is a process flow diagram of a method of forming a semiconductor structure according to one or more embodiments.
Figure 3A:
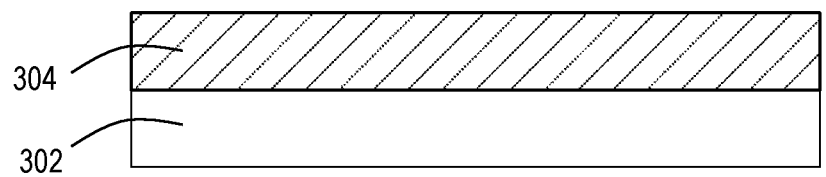
FIGS. 3A and 3B are schematic views of a semiconductor structure according to one or more embodiments.
Figure 3B:
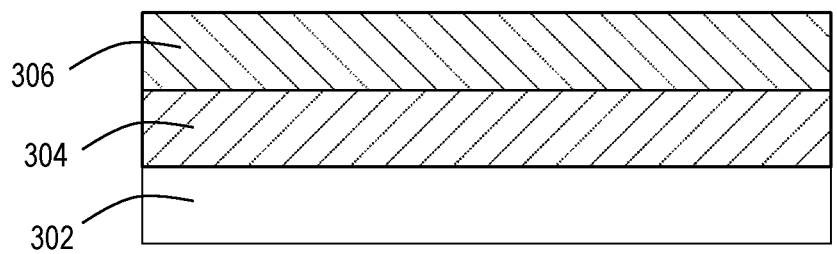

FIG. 2 is a process flow diagram of a method 200 of forming a semiconductor structure 300 according to one or more implementations of the present disclosure. FIGS. 3A and 3B are cross-sectional views of a portion of the semiconductor structure 300 corresponding to various states of the method 200. It should be understood that FIGS. 3A and 3B illustrate only partial schematic views of the semiconductor structure 300, and the semiconductor structure 300 may contain any number of transistor sections and additional materials having aspects as illustrated in the figures. It should also be noted although the method steps illustrated in FIG. 2 are described sequentially, other process sequences that include one or more method steps that have been omitted and/or added, and/or has been rearranged in another desirable order, fall within the scope of the embodiments of the disclosure provided herein.

The method 200 begins with an annealing process in operation 205. The anneal process may comprise spike annealing a substrate in a hydrogen ($H_2$) ambient at a temperature in a range of from 500° C. to 700° C. The annealing 205 may include a spike thermal anneal process performed in a rapid thermal processing chamber, such as RADOX™ chamber, available from Applied Materials, Inc., located in Santa Clara, California. The RTP chamber may be any of the processing chambers 120, 122, 124, 126, 128, and 130 illustrated in FIG. 1. Without intending to be bound by theory, it is thought that spike annealing the surface of the substrate 302 in an atmosphere of hydrogen ($H_2$) results in a smooth substrate surface 302 prior to film deposition, allowing for better channel mobility. In one or more embodiments, annealing 205 serves a different purpose compared to passivation annealing processes. In one or more embodiments, annealing in an ambient atmosphere of hydrogen ($H_2$) causes the hydrogen ($H_2$) to react with the substrate surface, e.g., silicon (Si), before film deposition in order to smoothen the substrate surface 302. In one or more embodiments, in subsequent high temperature annealing steps, the hydrogen-Silicon (H—Si) bonds are broken, and hydrogen is de-passivated on purpose after a film is deposited. In standard passivation processes, on the other hand, hydrogen-silicon (H—Si bonding) is maintained at the end of process.

In some embodiments, after annealing 205, a pre-clean process in operation 210 to pre-clean the surface of the substrate 302 is performed. The pre-clean process may include ozone ($O_3$) pre-clean or oxidizing the surface of the substrate 302 by a wet process using a solution, such as a Standard Clean 1 (SC1) solution including $NH_4OH$ (ammonium hydroxide), $H_2O_2$ (hydrogen peroxide), and $H_2O$ (water), or a dry etch process, for example, a SiConi™ remote plasma assisted dry etch process, in which the surface of the substrate 302 is exposed to $N_2$, $NF_3$, and $NH_3$ plasma by-products. In specific embodiments, after hydrogen ($H_2$) anneal, a pre-clean process 210 comprises an ozone ($O_3$) pre-clean or an SC1 wet process to pre-clean the surface of the substrate 302. The pre-clean process may be performed in a preclean chamber, such as the processing chamber 122 or 120 shown in FIG. 1.

While not illustrated in FIG. 2, in some embodiments, the pre-clean process 210 may occur prior to annealing 205.

In operation 220, an interface formation process is performed to form an interfacial layer 304 on the pre-cleaned surface of the substrate 302, as shown in FIG. 3A. The interface formation process may include a suitable thermal oxidation process, such as an enhanced in-situ steam generation (eISSG) process utilizing nitrous oxide ($N_2O$) gas. The interfacial layer 304 formed in operation 220 is a thin amorphous silicon oxide ($SiO_2$) layer, having a thickness of between about 3 Å and about 10 Å, for example, about 5 Å, corresponding to one or more monolayers of silicon oxide. In some embodiments, the interfacial layer 304 may be formed by an in-situ steam generation (ISSG) process utilizing $H_2$ and $O_2$ gases, or a rapid thermal oxidation (RTO) process utilizing $NH_3$ and $O_2$ gases. The interfacial layer 304 may act as a nucleation layer of a high-κ dielectric material layer to be deposited thereon and improve quality (e.g., such as interface state density, accumulation capacitance, frequency dispersion, and leakage current) of the interface between the substrate 302 and the high-κ dielectric material layer. The interface formation process may be performed in a processing chamber, such as the processing chamber 120, 122, 124, 126, 128, or 130 shown in FIG. 1.

In some embodiments, the interface formation process in operation 220 is omitted and the interfacial layer 304 is not formed prior to deposition of a high-κ dielectric material layer on the substrate 302. In that case, the interfacial layer 304 is formed by a thermal oxidation process in operation 240 or operation 290, described below, that thermally oxidizes the substrate 302 through a high-κ dielectric material layer deposited on the substrate 302. The interfacial layer 304 formed by the thermal oxidation process in operation 240 or operation 290 may be thick enough to ensure reliable device characteristics (e.g., such as interface state density, accumulation capacitance, frequency dispersion, and leakage current) and reduce atomic diffusion from the high-κ dielectric material layer to the substrate 302, having a thickness of between about 0.3 nm and about 1 nm, for example, about 0.5 nm.

In operation 230, a deposition process is performed to deposit a high-κ dielectric layer 306 on the exposed surface of the semiconductor structure 300 (i.e., the interfacial layer 304, as shown in FIG. 3B, if the interfacial layer 304 is formed in operation 220, and the substrate 302 if the interfacial layer 304 is not formed in operation 220). The high-κ dielectric layer 306 may be formed of high-κ dielectric material, such as hafnium dioxide ($HfO_2$), zirconium dioxide ($ZrO_2$), ytterbium oxide ($Y_2O_3$), or aluminum oxide ($Al_2O_3$). The deposition process may include an atomic layer deposition (ALD) process, in which a metal-containing precursor and an oxygen-containing precursor are alternately delivered to the exposed surface of the semiconductor structure 300. In some embodiments, the metal-containing precursor is purged prior to delivering the oxygen-containing precursor. The metal may be a transition metal, such as hafnium (Hf), zirconium (Zr), or titanium (Ti), a rare-earth metal, such as lanthanum (La), ytterbium (Yb), or yttrium (Y), an alkaline earth metal, such as strontium (Sr), or other metal such as aluminum (Al). For the oxidant, any oxygen-containing precursor may be used that may react with the metal. For example, the oxygen-containing precursor may be or include water, diatomic oxygen, ozone, a hydroxyl-containing precursor or alcohol, nitrogen-and-oxygen-containing precursors, plasma-enhanced oxygen including locally or remotely enhanced oxygen, or any other material including oxygen that may be incorporated with the metal to produce a layer of an oxide of the metal over the substrate 302. In one example, the metal containing precursor is hafnium tetrachloride ($HfCl_4$) and the oxidant is water ($H_2O$) to form a hafnium dioxide ($HfO_2$) layer. The ALD process may be performed at a temperature of between about 200° C. and about 400° C., for example, about 270° C. The high-κ dielectric layer 306, as deposited by the ALD process, may be amorphous and have a thickness of between about 10 Å and about 30 Å. The deposition process may be performed in a processing chamber, such as the processing chamber 120, 122, 124, 126, 128, or 130 shown in FIG. 1.

In operation 250, an optional post-deposition anneal process is performed to harden and densify the as-deposited high-κ dielectric layer 306. Crystallization of the as-deposited amorphous high-κ dielectric layer 306 may occur. The post-deposition anneal process may include a thermal anneal process in an inert ambient, such as in a nitrogen ($N_2$) and argon (Ar) ambient, performed in a rapid thermal processing (RTP) chamber, such as RADOX™ chamber, available from Applied Materials, Inc., located in Santa Clara, Calif. The RTP chamber may be any of the processing chambers 120, 122, 124, 126, 128, and 130 shown in FIG. 1. The post deposition anneal process may thermally harden and densify the interfacial layer 304 and the high-κ dielectric layer 306.

The post deposition anneal process may be performed for between about 1 second and about 60 seconds, at a temperature of between about 500° C. and about 800° C., and at a pressure of between about 0.01 Torr and 10 Torr.

In operation 240, alternative to the post-deposition anneal process in operation 250, an optional re-oxidation process is performed to thermally oxidize the substrate 302. The reoxidation process may include a thermal anneal process in an oxygen ($O_2$), nitrous oxide ($N_2O$), and $H_2$ ambient, performed in a rapid thermal processing (RTP) chamber, such as RADOX™ chamber, available from Applied Materials, Inc., located in Santa Clara, Calif. The RTP chamber may be any of the processing chambers 120, 122, 124, 126, 128, and 130 shown in FIG. 1. The re-oxidation process in operation 240 may thermally oxidize the underlying layer through the high-κ dielectric layer 306, and thus thicken the interfacial layer 304, if the interfacial layer 304 is formed in operation 220, to a thickness of between about 3 Å and about 10 Å, and form an interfacial layer 304 in the substrate 302 near the interface with the high-κ dielectric layer 306 if an interfacial layer 304 is not formed in operation 220.

The re-oxidation process may be performed for between about 1 second and about 30 seconds, at a temperature of between about 400° C. and about 900° C., and at a pressure of between about 0.01 Torr and 100 Torr.

In operation 260, a plasma nitridation process is performed to insert nitrogen atoms into vacancies and defects in the high-κ dielectric layer 306. The plasma nitridation process may be a decoupled plasma nitridation (DPN) process performed in a DPN chamber such as CENTURA® DPN chamber, available from Applied Materials, Inc., located in Santa Clara, Calif. The DPN chamber may be any of the processing chambers 120, 122, 124, 126, 128, and 130 shown in FIG. 1. The plasma nitridation process exposes the high-κ dielectric layer 306 to nitrogen plasma, which may allow nitrogen radicals or nitrogen atoms to be incorporated within the high-κ dielectric layer 306, throughout the thickness of the high-κ dielectric layer 306. During the plasma nitridation process, nitrogen atoms may form metastable bonds with oxygen (O). Gases that may be used in the plasma process include nitrogen containing gas, such as nitrogen ($N_2$), ammonia ($NH_3$), or mixtures thereof. In one example, the nitrogen gas is ammonia ($NH_3$) mixed with about 3% to about 8% of nitrogen ($N_2$). The plasma nitridation process may not change a thickness of the high-κ dielectric layer 306 as a result of the nitrogen incorporation to vacancies and defects in the as-deposited high-κ dielectric layer 306.

The nitridation process may be performed for between about 10 seconds and about 300 seconds, at a temperature of between about 0° C. and about 500° C.

In operation 270, an optional thermal nitridation process is performed to further insert nitrogen atoms into vacancies and defects in the plasma nitridated high-κ dielectric layer 306. The thermal nitridation process may include a thermal anneal process in an ammonia ($NH_3$) ambient, performed in a rapid thermal processing (RTP) chamber, such as RADOX™ chamber, available from Applied Materials, Inc., located in Santa Clara, Calif. The RTP chamber may be any of the processing chambers 120, 122, 124, 126, 128, and 130 shown in FIG. 1.

The thermal nitridation process may be performed for between about 10 seconds and about 300 seconds, at a temperature of between about 700° C. and about 900° C., and at a pressure of between about 10 Torr and 740 Torr.

In operation 280, a post-nitridation anneal process is performed to passivate the remaining chemical bonds in the plasma nitridated high-κ dielectric layer 306. The post-nitridation anneal process may include a spike thermal anneal process in a nitrogen ($N_2$) and argon (Ar) ambient, performed in a rapid thermal processing (RTP) chamber, such as RADOX™ chamber, available from Applied Materials, Inc., located in Santa Clara, Calif. The RTP chamber may be any of the processing chambers 120, 122, 124, 126, 128, and 130 shown in FIG. 1. The post-nitridation anneal process may passivate metastable nitrogen bonds formed in the plasma nitridation process in operation 250 and crystallization of the amorphous high-κ dielectric layer 306 may occur.

The spike thermal anneal process may be performed for between about 1 second and about 30 seconds, at a temperature of between about 700° C. and about 850° C., and at a pressure of between about 10 Torr and 740 Torr.

In operation 290, alternative to the post-nitridation anneal process in operation 280, a post-nitridation anneal and re-oxidation process is performed to simultaneously passivate the remaining chemical bonds in the high-k dielectric layer 306, as in operation 280, and thermally oxidize the substrate 302, as in operation 240. The post-nitridation anneal and reoxidation process in operation 290 is the same as the re-oxidation process in operation 240. Thus, the details of the post-nitridation anneal and re-oxidation process in operation 290 are omitted here.

In the embodiments described herein, the systems and the methods of forming high-quality thin high-κ dielectric material layers are provided. The properties of such high-κ dielectric material layers may be well controlled. For example, the nitridation processes in operations 260 and 270 may be controlled to provide a nitrogen incorporation in the high-κ dielectric layer 306 of between about 3 atomic % and about 20 atomic %, to achieve a higher κ-value than a higher nitrogen incorporation, and better structural stabilization than a lower nitrogen incorporation. The anneal processes in operations 250, 270, 280, and 290 may also be controlled to provide grains in the high-κ dielectric layer 306 having a size larger than about 20 Å, to reduce leakage currents through the high-K dielectric layer 306.

Figure 4:
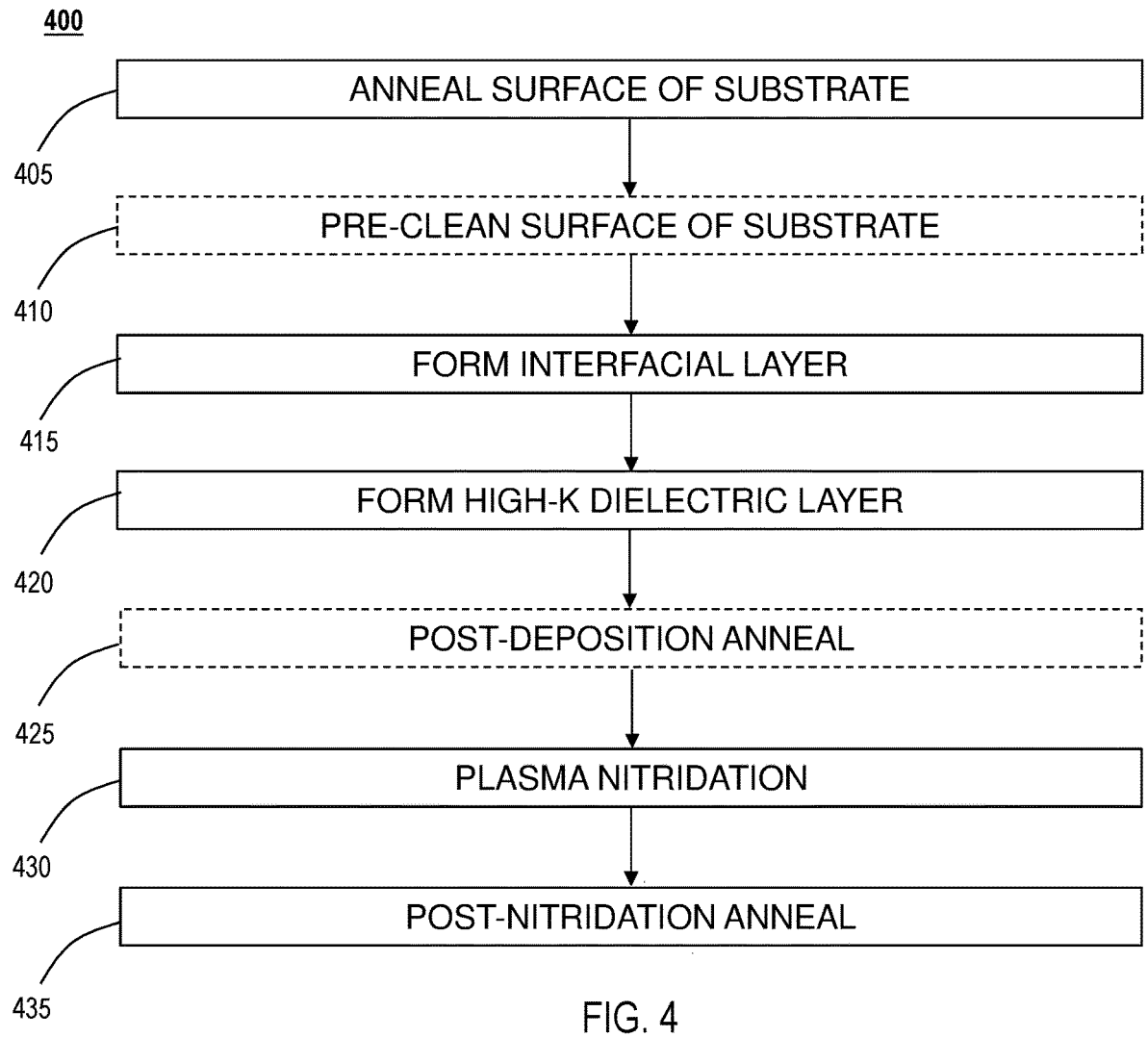
FIG. 4 illustrates a process flow diagram of a method of forming a semiconductor structure according to one or more embodiments.

FIG. 4 is a process flow diagram of a method 400 of forming a semiconductor structure 500 according to one or more implementations of the present disclosure. In one or more embodiments, the operations of the method 400 may be performed in one or more chambers incorporated on multi-chamber processing system 100 as previously described.

Method 400 may include one or more operations prior to the initiation of the stated method operations, including front end processing, deposition, etching, polishing, cleaning, or any other operations that may be performed prior to the described operations. The method may include a number of optional operations as denoted in the figure, which may or may not specifically be associated with the method according to the present technology. For example, many of the operations are described in order to provide a broader scope of the structural formation process, but are not critical to the technology, or may be performed by alternative methodology as will be discussed further below. Method 400 describes the operations shown schematically in FIGS. 5A-5F, the illustrations of which will be described in conjunction with the operations of method 400. It is to be understood that FIGS. 5A-5F illustrate only partial schematic views, and a substrate may contain any number of transistor sections and additional materials having aspects as illustrated in the figures.

Figure 5A:
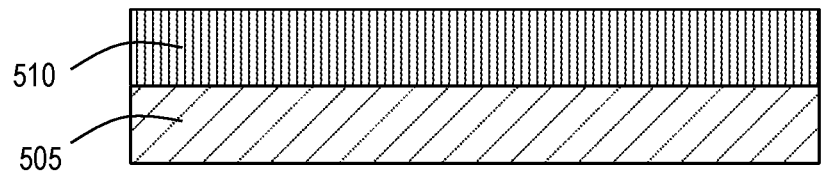
FIGS. 5A-5F illustrate schematic cross-sectional views of exemplary substrates according to one or more embodiments.
Figure 5B:
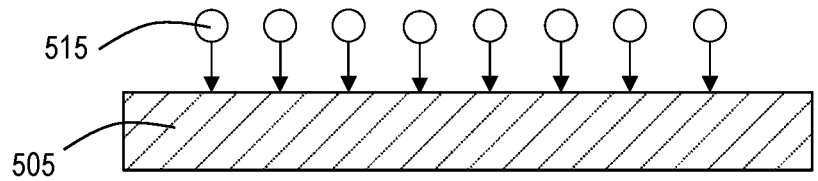
Figure 5C:
Figure 5D:
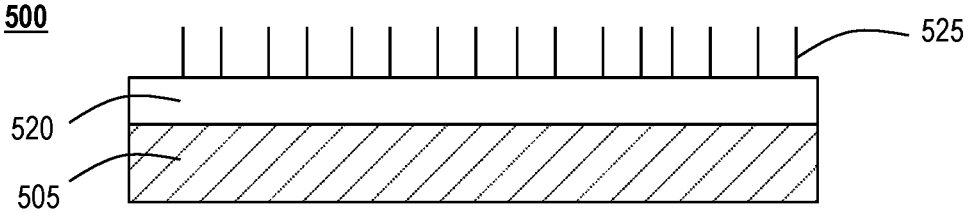

Method 400 may involve optional operations to develop the semiconductor structure to a particular fabrication operation. Although in some embodiments method 400 may be performed on a base structure, in some embodiments the method may be performed subsequent other material formation. As illustrated in FIG. 5A, the semiconductor structure may represent a device 500 after certain processing has been completed. For example, substrate 505 may be a planar material, or may be a structured device, which may include one or more materials configured as or defining posts, trenches, or other structures as would be understood are similarly encompassed by the present technology. Substrate 505 may include any number of materials including silicon or silicon-containing materials such as oxides, nitrides, and carbides of silicon, as well as any other materials that may be incorporated within a structure.

One or more material layers may be formed over some or all of substrate 505, as well as formed at least partially within the substrate, to produce a structure that may be a planarized or structured material in embodiments. As non-limiting examples, substrate 505 may be or include silicon, or may include a surface amount of silicon formed over an additional material, such as silicon oxide, and which may be a reduced portion of the silicon oxide leaving a silicon exposed surface. Substrate 505 may include a native oxide 510 as illustrate in FIG. 5A. The exposed material at a surface of substrate 505 may be etched, planarized, or otherwise processed to produce an intermittent pattern in some embodiments. Although illustrated as a single instance, it is to be understood that device 500 may include a small section of a larger process integration that may include any number of additional sections that may be similar or different to the objects shown. Substrate 505 may be housed or positioned in a processing region of a semiconductor processing chamber, and method 400 may be performed to produce a semiconductor material on the substrate, such as a high-κ dielectric material.

The method 400 may begin with an annealing process in operation 405. The anneal process may comprise spike annealing a substrate in a hydrogen ($H_2$) ambient at a temperature in a range of from 500° C. to 700° C. The annealing 405 may include a spike thermal anneal process performed in a rapid thermal processing chamber, such as RADOX™ chamber, available from Applied Materials, Inc., located in Santa Clara, California. The RTP chamber may be any of the processing chambers 120, 122, 124, 126, 128, and 130 illustrated in FIG. 1. Without intending to be bound by theory, it is thought that spike annealing the surface of the substrate 505 in an atmosphere of hydrogen ($H_2$) results in a smooth substrate surface 505 prior to film deposition, allowing for better channel mobility. In one or more embodiments, annealing 405 serves a different purpose compared to passivation annealing processes. In one or more embodiments, annealing in an ambient atmosphere of hydrogen ($H_2$) causes the hydrogen ($H_2$) to react with the substrate surface, e.g., silicon (Si), before film deposition in order to smoothen the substrate surface 505. In one or more embodiments, in subsequent high temperature annealing steps, the hydrogen-silicon (H—Si) bonds are broken and hydrogen is de-passivated on purpose after a film is deposited. In standard passivation processes, on the other hand, hydrogen-silicon (H—Si bonding) is maintained at the end of process.

In some embodiments, after annealing 405, method 400 may include removing a native oxide 510 (as in FIG. 5A) from the substrate 505 in operation 410. The removing a native oxide 410 may be or include flowing a fluorine-containing precursor and a hydrogen-containing precursor. Fluorine-containing precursors may be or include nitrogen trifluoride as well as any other fluorine-containing precursor. Hydrogen-containing precursors may be characterized by an amine group [—$NH_2$], or other nitrogen-containing or hydrogen-containing group. For example, hydrogen-containing precursors may be or include nitrogen-and-hydrogen-containing precursors, such as ammonia as one non-limiting example. The flowing may include flowing the fluorine-containing precursor and the hydrogen-containing precursor into a remote plasma region. The remote plasm region may be fluidly coupled to the substrate processing region. A plasma may be formed to produce plasma effluents. A flow rate of the fluorine-containing precursor and a flow rate of the hydrogen-containing precursor may be characterized by a hydrogen-to-fluorine atomic flow ratio of less than 1:2. The native oxide 410 is removed by flowing the plasma effluents into the substrate processing region while forming solid by-products on the surface of the substrate. Without being bound to any particular theory, the flow may leave of a layer of fluorine on the substrate surface that promotes interface formation at operation 415 with the fluorine termination serving to enhance reliability. The solid by-products are sublimated by increasing a temperature of the substrate above a sublimation temperature of the solid by-products. After sublimation, the substrate 505 is free or substantially free of native oxide. The removing may be or include removing the native oxide to a depth of up to or about 20 Å.

Method 400 may include a SiConi™ etch in operation 410, which may be a remote plasma assisted dry etch process involving the simultaneous exposure of a substrate, such as substrate 505 of FIG. 5A, to $H_2$, $NF_3$, and/or $NH_3$ plasma by-products. Removing a native oxide in operation 410 may by an in-situ dry chemical process where the substrate surface may not be exposed to atmosphere or an oxygen-containing environment. Removing a native oxide in operation 410 may be performed in a first processing chamber in some embodiments of method 400. Method 400 may include transferring the substrate from the first processing chamber to a second processing chamber prior to forming a high-k dielectric material as in operation 420. Method 400 may include performing operations in one or more processing chambers without exposing the substrate surface to atmosphere or air. Method 400 may include maintaining a vacuum within system 100 during removing in operation 410. Maintaining an integrated vacuum may advantageously reduce surface contamination. The transferring may occur between one or more chambers on a single platform or may occur between chambers on multiple platforms. However, by utilizing a single platform, the avoidance of substrate exposure to an oxygen and/or moisture environment may be better secured.

In one or more embodiments, the method 400 may include delivering nitrous oxide and thermally annealing the substrate surface to form an oxide-containing interface in operation 415. The nitrous oxide 515 delivered to the substrate 505 as in FIG. 5B may help to control how much of the substrate 505, having a surface free of native oxide, may be oxidized to form the oxide-containing interface 520 as in FIG. 5C. Operation 415 may include a thermal based reaction using steam, such as an in situ steam generation (ISSG) process whereby oxidation takes place at a lower rate as compared with conventional thermal techniques utilizing hydrogen and/or oxygen. The nitrogen may serve as a carrier for oxygen and may not become part of the interface or substrate. The oxide-containing interface formed may be high quality and highly ordered, meaning a crystallographic structure free of or substantially free of defects. This may provide an interface 520 that may prevent nitrogen in subsequent operations, from accessing closely to the channel region, thus preventing leakage. The resultant oxide-containing interface may include silicon dioxide. The oxide-containing interface 520 formed may have a thickness of up to or about 5 Å. Method 400 may include removal of a thicker native oxide in operation 410 that may be replaced in subsequent operations by a thinner oxide-containing interface 520.

Method 400 may include delivering a pre-treatment precursor to the substrate. The pre-treatment precursor may be or include a nitrogen-containing precursor or an oxygen-containing precursor. The precursor may contact the substrate and may form or introduce reactive ligands on an exposed surface of the substrate, which is shown as ligands 520 in FIG. 5D. Unlike conventional technologies, the present technology may utilize a pretreatment configured to produce an orderly growth of high-k dielectric material in subsequent operations.

For example, in some embodiments the substrate may be or include an exposed surface of silicon. The substrate 505 may itself be silicon or may be some other silicon-containing material that is reduced or modified to exhibit a silicon surface. As one non-limiting example, where substrate 505 may include silicon oxide, an initial pre-treatment may include removing oxygen from a surface of the structure, such as with a hydrogen-containing precursor, for example. A thin, surface layer of silicon may then be exposed. Without being bound to any particular theory, silicon may provide improved base characteristics for receiving nitrogen-containing precursors relative to silicon oxide in some embodiments. This may afford a superior formation of certain high-k dielectric materials.

The pre-treatment precursor may be or include any nitrogen-containing or oxygen-containing precursor. Oxygen-containing precursors may be characterized by a hydroxyl group [—OH], which may be incorporated on the surface of substrate 505. Nitrogen-containing precursors may be characterized by an amine group [—NH$_2$], or other nitrogen-containing group. For example, nitrogen-containing precursors may be or include nitrogen-and-hydrogen-containing precursors, such as ammonia as one non-limiting example, or nitrogen-and-oxygen-containing precursors, or any other precursor including nitrogen.

Figure 5E:
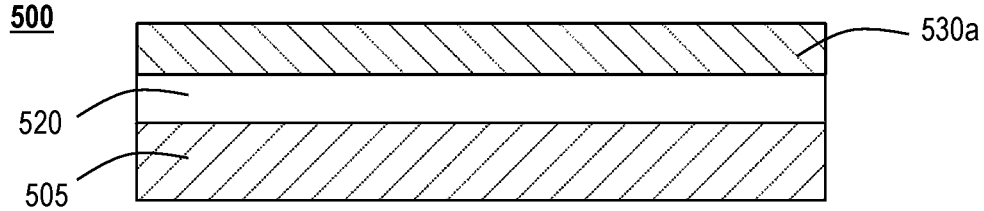
Figure 5F:
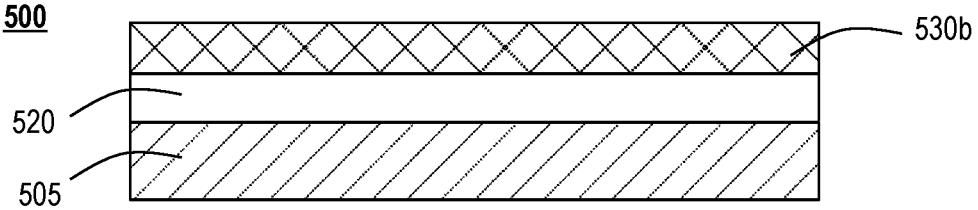

The surface terminations in some embodiments may be or include a hydroxyl group or an amine-group-terminated surface. Method 400 may then include forming a high-k dielectric material overlying the substrate at operation 420. The present technology may encompass any formation or deposition of the high-k material, although in some embodiments formation operation 420 may be or include an atomic layer deposition, or any other atomic layer deposition chamber. The formation may be performed directly after pre-treating the substrate surface and may be performed in the same chamber as the pre-treatment or in an additional chamber, such as an additional chamber incorporated on the same system, such as system 100. In some embodiments, vacuum conditions may be maintained while the substrate is transferred from the pre-treatment chamber to the deposition or formation chamber, which may limit exposure of the substrate to air.

Where an atomic layer deposition process is performed to form the high-k dielectric material, a metal-containing precursor may be delivered to the substrate to react with the pretreated surface. For example, a transition-metal-containing precursor, a poor-metal-containing precursor, or a lanthanide-metal-containing precursor may be delivered to the processing chamber to interact with the reactive ligands exposed on the substrate from the pre-treatment. An oxygen-containing precursor may then be delivered in a second operation, such as subsequent a purge of the metal-containing precursor. This may produce an oxide layer by atomic layer deposition, such as layer 530a as illustrated in FIG. 5E. In one non-limiting example, a hafnium-containing precursor may be delivered in a first operation and an oxidant may be delivered in a second operation for producing a hafnium oxide film. Additional metal-containing precursors may include zirconium-containing precursors for producing zirconium-containing materials, as well as any other number of metal-containing precursors for producing additional metal oxide structures. For hafnium-containing precursors, and similarly for any alternative metals, the precursors may be or include halogen-containing precursors, oxygen-containing precursors, hydrogen-containing precursors, or carbon-containing precursors in any of which hafnium is incorporated.

For the oxidant, any oxygen-containing precursor may be used that may react with the metal-containing materials. For example, the oxygen-containing precursor may be or include water, diatomic oxygen, ozone, a hydroxyl-containing precursor or alcohol, nitrogen- and oxygen-containing precursors, plasma-enhanced oxygen including locally or remotely enhanced oxygen, or any other material including oxygen that may be incorporated with the metal, such as hafnium, to produce a metal oxide material layer overlying the substrate. Again, any of the metal-containing materials noted above may be used in embodiments of the present technology, and may include any of the grouped metals, which may include, and may not be limited to, hafnium, zirconium, silicon, lanthanum, aluminum, titanium, strontium, or combinations of these materials, such as, for example, hafnium silicate.

When pre-treatments according to embodiments of the present technology are performed, the structure of the metal-containing material can be formed or deposited in an ordered way to produce a more uniform grain structure. This may be produced by forming the reactive ligands of the pre-treatment precursor over a more structured surface material, such as silicon. Additionally, by performing the pre-treatment exposure at certain conditions, additional improvements may be afforded.

The pre-treatment may be performed at a temperature configured to activate the precursor and/or the surface of the substrate. For example, in a situation in which a nitrogen- and hydrogen-containing precursor may be used as the pre-treatment precursor, the substrate may be maintained at a temperature greater than or about 300° C. while delivering the precursor. Similarly, a pre-treatment with an oxygen-containing precursor may also be performed while maintaining a substrate temperature greater than or about 300° C. For any pre-treatment operation the substrate may also be maintained at a temperature greater than or about 400° C., greater than or about 500° C., greater than or about 600° C., greater than or about 700° C., greater than or about 800° C., or greater. As temperature for the pre-treatment decreases below or about 500° C., the effectiveness may be reduced. Similarly, as temperatures are increased above or about 700° C., nucleation may not be improved, and excess precursor may be incorporated on the surface, which may degrade the mobility of the device. Consequently, in some embodiments the temperature may be maintained between about 500° C. and about 700° C. during the pre-treatment.

Similarly, exposure time may affect the amount of nitrogen-containing precursor incorporation, and thus to limit mobility losses of the produced device, the precursor exposure may be less than or about 3 minutes, and in some embodiments the exposure time may be less than or about 2.5 minutes, less than or about 2 minutes, less than or about 1.5 minutes, less than or about 1 minute, less than or about 45 seconds, less than or about 30 seconds, less than or about 15 seconds, or less. Once an appropriate amount of amine groups have been incorporated, the formation may be performed. The formation, including atomic layer formation may be performed at any temperature, although in some embodiments atomic layer deposition may be performed at a temperature below or about the temperature at which the pre-treatment is performed, regardless of whether the operations are performed in the same or different chambers. For example, the atomic layer deposition may be performed at a second temperature relative to the pre-treatment temperature, and the formation temperature may be less than or about 500° C. in embodiments and may be less than or about 450° C., less than or about 400° C., less than or about 350° C., less than or about 300° C., less than or about 250° C., or less.

After the layer of high-k material has been formed or deposited, one or more posttreatments may be performed. In some embodiments, the substrate may be transferred from the deposition chamber to another chamber or set of chambers for post-treating the materials. Similar to that explained above, the transfer may occur on a single processing system having multiple chambers, and thus the transfer from or between any of these chambers may be performed while maintaining vacuum conditions. Method 400 may then include one or more additional post-treatment operations. The post-treatment operations may include one or more operations performed in one or more chambers, including multiple chambers on the same cluster tool. Post-treatment operations may include an oxidation, a nitridation 430, and/or a thermal anneal 425.

As noted above, the pre-treatment operation may be performed to provide sufficient terminal moieties to afford the uniform growth described previously, while limiting excess precursor from being incorporated with the substrate. For example, an incorporated nitrogen interface may reduce mobility of the produced transistor, or how quickly a carrier can move through the structure. Although the pre-treatment described above may further improve scaling of high-k films, if not controlled, the pre-treatment may actually degrade device mobility. However, in some embodiments, one post-treatment may include oxidizing the formed high-k material with a second oxygen-containing precursor relative to a first oxygen-containing precursor that may be used in the pre-treatment operation.

For example, an oxidation operation utilizing any of the above-noted oxygen-containing precursors may be performed to further oxidize the film after formation. The deposition or formation of the high-k film may produce a porous film, or a film including vacancies in the structure. By performing an oxidation operation, oxygen species may permeate the film filling vacancies as illustrated by layer 530b, as well as producing an oxide material at the interface of the high-k material, such as optional layer 520 if not formed in previous operations described above. This may improve the underlying interface from the amine terminal groups, which may increase the mobility performance of the device. To limit an excessive increase in an underlying oxide layer, the oxidation operation may be performed for a limited time period and may be performed within any of the previously noted time ranges.

Post-treatment operation 430 may include further contacting the substrate with a second nitrogen-containing precursor relative to the pre-treatment nitrogen-containing precursor, when used. The second nitrogen-containing precursor may include any nitrogen-containing precursor described above, and may include nitrogen gas, as well as any nitrogen-containing precursor noted elsewhere. The second nitrogen-containing precursor may include a plasma-activated or enhanced nitrogen-containing precursor, a thermally-activated nitrogen, or some other nitrogen precursor, which may allow nitrogen radicals or nitrogen atoms to be incorporated within the high-k structure, which may stabilize the film or settle the film towards an equilibrium state. Unlike an oxidation operation, the nitridation may not increase a thickness of an underlying layer, such as silicon oxide, and may also slightly increase the k-value of the produced film.

Nitrogen incorporation may be controlled to limit the incorporation in the film, in order to maintain the structural and electrical properties. In some embodiments, a post-treatment nitridation may incorporate less than or about 20 atomic % nitrogen at a surface region of the high-k film, and may incorporate less than or about 15 atomic % nitrogen, less than or about 10 atomic % nitrogen, less than or about 8 atomic % nitrogen, less than or about 6 atomic % nitrogen, less than or about 4 atomic % nitrogen, less than or about 2 atomic % nitrogen, or less. In some embodiments, an incorporation between about 3 atomic % and about 7 atomic % may maintain a higher k-value than higher nitrogen incorporation and may better stabilize the film than lower nitrogen incorporation. By surface region may be meant an exposed surface of the material, although the nitrogen incorporation may extend to any distance within the film, and may be consistent, or form a reducing gradient through the material.

A post-treatment oxidation or nitridation may be performed at any of the temperatures noted previously, although in some embodiments the post-treatment oxidation and/or nitridation may be performed at a temperature range below or about 500° C., and may be performed at a temperature range below or about 400° C., below or about 300° C., below or about 200° C., below or about 100° C., or less depending on the operation being performed.

A post-treatment anneal 425, 435 may be performed subsequent any of the operations, including any of the noted post-treatment operations. The post-treatment anneal may be performed in any chamber in which a previous operation is performed, or may involve transfer to a different chamber, such as one configured to perform a rapid thermal anneal process, for example. Again, the chamber may be incorporated on the same platform as other chambers, which may allow a transfer between chambers while maintaining vacuum conditions. The post-treatment anneal may further align the film bonding and further stabilize the film. In embodiments the posttreatment anneal may be performed at a third temperature relative to the first temperature, where the third temperature may be above or about the first temperature. For example, the post-treatment anneal may be performed at a temperature above or about 400° C., and in embodiments may be performed at a temperature above or about 500° C., above or about 600° C., above or about 700° C., above or about 800° C., above or about 900° C., or higher.

By performing a pre-treatment and/or post-treatments according to embodiments of the present technology, improved high-k materials may be produced. The layer of high-k material may be produced to any thickness including up to or about several nanometers. However, due to the preferred grain structure produced by the present technology, thinner effective oxide thickness may be produced without loss to gate leakage performance. High-k materials produced according to the present technology may be characterized by k-values greater than or about 10 and may be characterized by k-values greater than or about 15, greater than or about 20, greater than or about 21, greater than or about 22, greater than or about 23, greater than or about 24, greater than or about 25, or greater.

As noted above, the present technology further allows improved dielectric constants compared to conventional technologies. Additionally, because of the produced grain structure, gate leakage currents associated with the film may be less than or about one tenth of the gate leakage current of a similar thickness film of silicon oxide, and the gate leakage currents may be less than or about one hundredth of the gate leakage current of a similar thickness film of silicon oxide, less than or about one thousandth of a similar thickness film of silicon oxide, less than or about 1/5,000 of a similar thickness film of silicon oxide, less than or about 1/10,000 of a similar thickness film of silicon oxide, less than or about 1/20,000 of a similar thickness film of silicon oxide, less than or about 1/50,000 of a similar thickness film of silicon oxide, less than or about 1/100,000 of a similar thickness film of silicon oxide, or less. By producing films according to embodiments of the present technology, formed films having a beneficial morphology may be produced, which may enhance the electrical characteristics of the film compared to conventional technologies.

Figure 6:
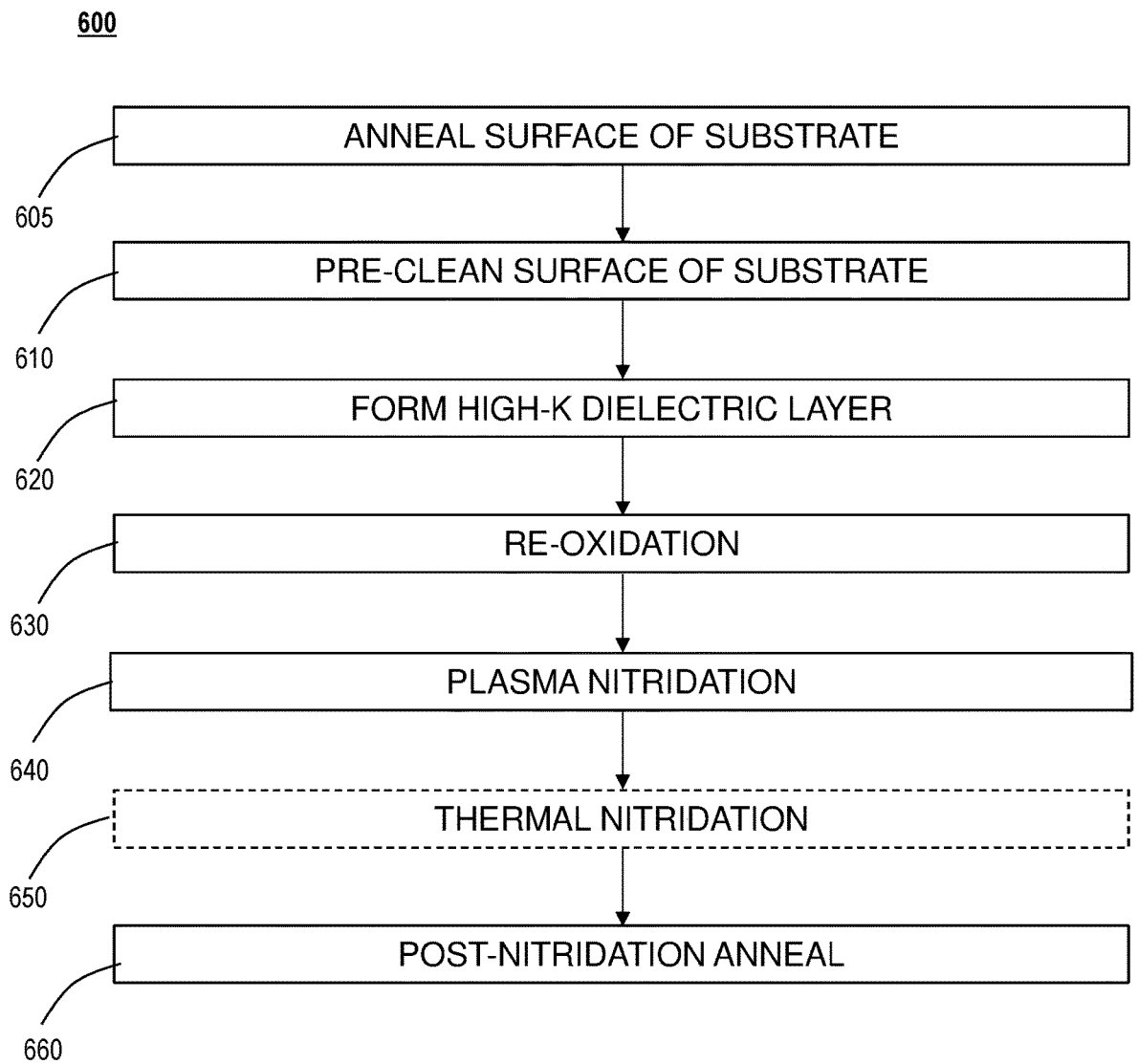
FIG. 6 is a process flow diagram of a method of forming a semiconductor structure according to one or more embodiments.
Figure 7A:
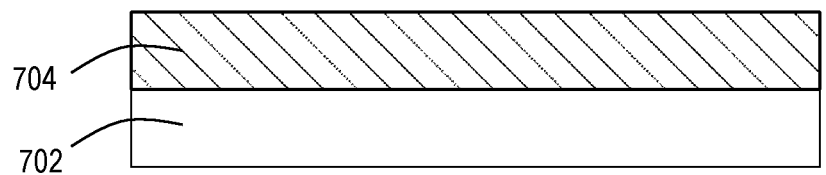
FIGS. 7A and 7B are schematic views of a semiconductor structure according to one or more embodiments.
Figure 7B:
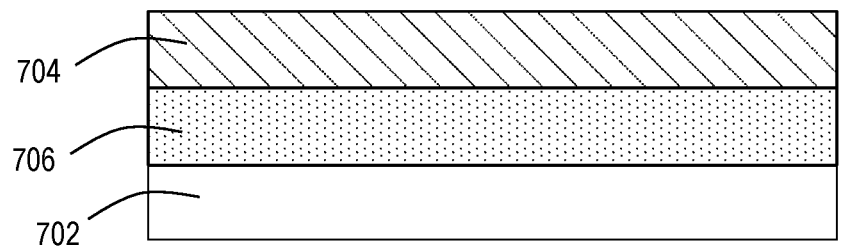

FIG. 6 is a process flow diagram of a method 600 of forming a semiconductor structure 700 according to one or more implementations of the present disclosure. FIGS. 7A and 7B are cross-sectional views of a portion of the semiconductor structure 700 corresponding to various states of the method 600. It should be understood that FIGS. 7A and 7B illustrate only partial schematic views of the semiconductor structure 700, and the semiconductor structure 700 may contain any number of transistor sections and additional materials having aspects as illustrated in the figures. It should also be noted although the method steps illustrated in FIG. 6 are described sequentially, other process sequences that include one or more method steps that have been omitted and/or added, and/or has been rearranged in another desirable order, fall within the scope of the embodiments of the disclosure provided herein.

The method 600 begins with an annealing process in operation 605. The anneal process may comprise spike annealing a substrate in a hydrogen ($H_2$) ambient at a temperature in a range of from 500° C. to 700° C. The annealing 605 may include a spike thermal anneal process performed in a rapid thermal processing chamber, such as RADOX™ chamber, available from Applied Materials, Inc., located in Santa Clara, California. The RTP chamber may be any of the processing chambers 120, 122, 124, 126, 128, and 130 illustrated in FIG. 1. Without intending to be bound by theory, it is thought that spike annealing the surface of the substrate 702 in an atmosphere of hydrogen ($H_2$) results in a smooth substrate surface 702 prior to film deposition, allowing for better channel mobility. In one or more embodiments, annealing 605 serves a different purpose compared to passivation annealing processes. In one or more embodiments, annealing in an ambient atmosphere of hydrogen ($H_2$) causes the hydrogen ($H_2$) to react with the substrate surface, e.g., silicon (Si), before film deposition in order to smoothen the substrate surface 702. In one or more embodiments, in subsequent high temperature annealing steps, the hydrogen-silicon (H—Si) bonds are broken and hydrogen is de-passivated on purpose after a film is deposited. In standard passivation processes, on the other hand, hydrogen-silicon (H—Si) bonding is maintained at the end of process.

In some embodiments, after annealing 605, a pre-clean process in operation 610 to pre-clean the surface of the substrate 702 is performed. The pre-clean process may oxidize the surface of the substrate 702 through use of an ozone ($O_3$) process or a wet process using a solution, such as a Standard Clean 1 (SC1) solution including $NH_4OH$ (ammonium hydroxide), $H_2O_2$ (hydrogen peroxide), and $H_2O$ (water), or a dry etch process, for example, a SiConi™ remote plasma assisted dry etch process, in which the surface of the substrate 702 is exposed to $N_2$, $NF_3$, and $NH_3$ plasma by-products. The pre-clean process may be performed in a preclean chamber, such as the processing chamber 122 or 120 shown in FIG. 1.

While not illustrated in FIG. 6, in some embodiments, the pre-clean process 610 may occur prior to annealing 605.

In operation 620, a deposition process is performed to deposit a high-κ dielectric layer 704 on the exposed surface of the semiconductor structure 700. The high-κ dielectric layer 704 may be formed of high-κ dielectric material, such as hafnium dioxide ($HfO_2$), zirconium dioxide ($ZrO_2$), ytterbium oxide ($Y_2O_3$), or aluminum oxide ($Al_2O_3$). The deposition process may include an atomic layer deposition (ALD) process, in which a metal-containing precursor and an oxygen-containing precursor are alternately delivered to the exposed surface of the semiconductor structure 700. In some embodiments, the metal-containing precursor is purged prior to delivering the oxygen-containing precursor. The metal may be a transition metal, such as hafnium (Hf), zirconium (Zr), or titanium (Ti), a rare-earth metal, such as lanthanum (La), ytterbium (Yb), or yttrium (Y), an alkaline earth metal, such as strontium (Sr), or other metal such as aluminum (Al). For the oxidant, any oxygen-containing precursor may be used that may react with the metal. For example, the oxygen-containing precursor may be or include water, diatomic oxygen, ozone, a hydroxyl-containing precursor or alcohol, nitrogen-and-oxygen-containing precursors, plasma-enhanced oxygen including locally or remotely enhanced oxygen, or any other material including oxygen that may be incorporated with the metal to produce a layer of an oxide of the metal over the substrate 702. In one example, the metal containing precursor is hafnium tetrachloride ($HfCl_4$) and the oxidant is water ($H_2O$) to form a hafnium dioxide ($HfO_2$) layer. The ALD process may be performed at a temperature of between about 200° C. and about 400° C., for example, about 270° C. The high-κ dielectric layer 704, as deposited by the ALD process, may be amorphous and have a thickness of between about 10 Å and about 30 Å. The deposition process may be performed in a processing chamber, such as the processing chamber 120, 122, 124, 126, 128, or 130 shown in FIG. 1.

In operation 630, a re-oxidation process is performed to thermally oxidize the substrate 702. The reoxidation process may include a thermal anneal process in an oxygen ($O_2$), nitrous oxide ($N_2O$), and $H_2$ ambient, performed in a rapid thermal processing (RTP) chamber, such as RADOX™ chamber, available from Applied Materials, Inc., located in Santa Clara, Calif. The RTP chamber may be any of the processing chambers 120, 122, 124, 126, 128, and 130 shown in FIG. 1. The re-oxidation process in operation 630 may thermally oxidize the underlying layer through the high-κ dielectric layer 704 and form an interfacial layer 706 on the substrate 702 near the interface with the high-κ dielectric layer 704.

The re-oxidation process may be performed for between about 1 second and about 30 seconds, at a temperature of between about 400° C. and about 900° C., and at a pressure of between about 0.01 Torr and 100 Torr.

In operation 640, a plasma nitridation process is performed to insert nitrogen atoms into vacancies and defects in the high-κ dielectric layer 704. The plasma nitridation process may be a decoupled plasma nitridation (DPN) process performed in a DPN chamber such as CENTURA® DPN chamber, available from Applied Materials, Inc., located in Santa Clara, Calif. The DPN chamber may be any of the processing chambers 120, 122, 124, 126, 128, and 130 shown in FIG. 1. The plasma nitridation process exposes the high-κ dielectric layer 704 to nitrogen plasma, which may allow nitrogen radicals or nitrogen atoms to be incorporated within the high-κ dielectric layer 704, throughout the thickness of the high-κ dielectric layer 704. During the plasma nitridation process, nitrogen atoms may form metastable bonds with oxygen (O). Gases that may be used in the plasma process include nitrogen containing gas, such as nitrogen ($N_2$), ammonia ($NH_3$), or mixtures thereof. In one example, the nitrogen gas is ammonia ($NH_3$) mixed with about 3% to about 8% of nitrogen ($N_2$). The plasma nitridation process may not change a thickness of the high-κ dielectric layer 704 as a result of the nitrogen incorporation to vacancies and defects in the as-deposited high-κ dielectric layer 704.

The nitridation process may be performed for between about 10 seconds and about 300 seconds, at a temperature of between about 0° C. and about 500° C.

In operation 650, an optional thermal nitridation process is performed to further insert nitrogen atoms into vacancies and defects in the plasma nitridated high-κ dielectric layer 704. The thermal nitridation process may include a thermal anneal process in an ammonia ($NH_3$) ambient, performed in a rapid thermal processing (RTP) chamber, such as RADOX™ chamber, available from Applied Materials, Inc., located in Santa Clara, Calif. The RTP chamber may be any of the processing chambers 120, 122, 124, 126, 128, and 130 shown in FIG. 1.

The thermal nitridation process may be performed for between about 10 seconds and about 300 seconds, at a temperature of between about 700° C. and about 900° C., and at a pressure of between about 10 Torr and 740 Torr.

In operation 660, a post-nitridation anneal process is performed to passivate the remaining chemical bonds in the plasma nitridated high-κ dielectric layer 704. The post-nitridation anneal process may include a spike thermal anneal process in a nitrogen ($N_2$) and argon (Ar) ambient, performed in a rapid thermal processing (RTP) chamber, such as RADOX™ chamber, available from Applied Materials, Inc., located in Santa Clara, Calif. The RTP chamber may be any of the processing chambers 120, 122, 124, 126, 128, and 130 shown in FIG. 1. The post-nitridation anneal process may passivate metastable nitrogen bonds formed in the plasma nitridation process in operation 640 and crystallization of the amorphous high-κ dielectric layer 704 may occur.

The spike thermal anneal process may be performed for between about 1 second and about 30 seconds, at a temperature of between about 700° C. and about 850° C., and at a pressure of between about 10 Torr and 740 Torr.

In the embodiments described herein, the systems and the methods of forming high-quality thin high-κ dielectric material layers are provided. The properties of such high-κ dielectric material layers may be well controlled. For example, the nitridation process in operations 640 may be controlled to provide a nitrogen incorporation in the high-κ dielectric layer 704 of between about 3 atomic % and about 20 atomic %, to achieve a higher κ-value than a higher nitrogen incorporation, and better structural stabilization than a lower nitrogen incorporation. The anneal process in operations 660 may also be controlled to provide grains in the high-κ dielectric layer 704 having a size larger than about 20 Å, to reduce leakage currents through the high-κ dielectric layer 704.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. A method of forming a semiconductor structure, the method comprising:
   annealing a silicon surface of a substrate in a hydrogen ($H_2$) ambient at a temperature in a range of from 500° C. to 700° C. such that the hydrogen ($H_2$) reacts with the silicon surface to form a smooth surface having hydrogen-silicon (H—Si) bonding termination;
   followed by, in a processing system without breaking vacuum:
   depositing a high-κ dielectric layer directly on the smooth surface, the high-κ dielectric layer having vacancies and defects when deposited;
   performing a re-oxidation process through the high-κ dielectric layer in an ambient of oxygen ($O_2$), nitrous oxide ($N_2O$), and hydrogen ($H_2$) at a temperature in a range of from 400° C. to 900° C. to thermally oxidize the smooth surface and form an oxide-containing interfacial layer on the silicon surface of the substrate at an interface with the high-κ dielectric layer, the oxide-containing interfacial layer having a thickness in a range of from 3 Å to 10 Å;
   performing a plasma nitridation process at a temperature of about 0° C. to about 500° C. and for a time period in a range of from about 10 seconds to about 300 seconds to insert nitrogen atoms in the vacancies and defects of the high-κ dielectric layer to form a plasma nitridated high-κ dielectric layer; and
   performing a post-nitridation anneal process to passivate chemical bonds in the plasma nitridated high-κ dielectric layer,
   the depositing of the high-κ dielectric layer, the performing of the re-oxidation process, the performing of the plasma nitridation process, and the performing of the post-nitridation anneal process being performed in the processing system without breaking vacuum.

2. The method of claim 1, wherein the plasma nitridation process comprises exposing the high-κ dielectric layer to a plasma comprising a mixture of nitrogen ($N_2$) and ammonia ($NH_3$).

3. The method of claim 1, wherein the post-nitridation anneal process comprises spike annealing the high-κ dielectric layer in a nitrogen ($N_2$) and argon (Ar) ambient at a temperature in a range of from 700° C. to 850° C.

4. The method of claim 1, wherein the high-κ dielectric layer comprises hafnium oxide.

5. The method of claim 1, further comprising pre-cleaning the silicon surface of the substrate prior to annealing the silicon surface of the substrate.

6. The method of claim 5, wherein pre-cleaning the silicon surface comprises flowing a fluorine-containing precursor and a hydrogen-containing precursor over the silicon surface to remove a native oxide and form a pre-cleaned surface.

7. The method of claim 5, wherein pre-cleaning the silicon surface comprises exposing the silicon surface to a dry etch process including $N_2$, $NF_3$, and $NH_3$ plasma by-products to remove native oxide and form a pre-cleaned surface.

* * * * *